United States Patent
Miyamoto

(10) Patent No.: US 12,112,789 B2
(45) Date of Patent: Oct. 8, 2024

(54) APPARATUSES AND METHODS FOR INPUT BUFFER ENABLE CLOCK SYNCHRONIZATION

(71) Applicant: MICRON TECHNOLOGY, INC., Boise, ID (US)

(72) Inventor: Takayuki Miyamoto, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 17/752,553

(22) Filed: May 24, 2022

(65) Prior Publication Data
US 2023/0410879 A1 Dec. 21, 2023

(51) Int. Cl.
| | |
|---|---|
| G11C 16/04 | (2006.01) |
| G06F 13/16 | (2006.01) |
| G11C 11/4076 | (2006.01) |
| G11C 11/4096 | (2006.01) |
| H03K 19/20 | (2006.01) |

(52) U.S. Cl.
CPC ...... *G11C 11/4076* (2013.01); *G06F 13/1673* (2013.01); *G11C 11/4096* (2013.01); *H03K 19/20* (2013.01)

(58) Field of Classification Search
CPC .................. G11C 11/4076; G11C 11/4096
See application file for complete search history.

(56) References Cited

U.S. PATENT DOCUMENTS

| | | | | |
|---|---|---|---|---|
| 5,432,462 A | * | 7/1995 | Obregon | H03K 19/0016 326/85 |
| 6,147,540 A | * | 11/2000 | Coddington | H03K 19/018585 327/333 |
| 6,778,548 B1 | * | 8/2004 | Burton | H04L 49/9063 370/429 |

* cited by examiner

*Primary Examiner* — Pho M Luu
(74) *Attorney, Agent, or Firm* — Dorsey & Whitney LLP

(57) ABSTRACT

Apparatuses, systems, and methods for input buffer enable clock synchronization. A command shifter receives a command, such as a write command. The command shifter passes the command through latches of the shifter in synchronization with a clock signal. Data buffer enable logic provides a data buffer enable signal with a level based on how long it takes the command to pass through the command shifter. The data buffer enable logic synchronizes changes to the level of the data buffer enable signal to the clock signal.

26 Claims, 9 Drawing Sheets

APPARATUSES AND METHODS FOR INPUT BUFFER ENABLE CLOCK SYNCHRONIZATION

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

During access operations, the memory may receive a command and activate input buffers or output buffers to receive or send data via input/output pads of the memory device. It may be important to ensure that the input or output buffers remain active while data is being sent or received, for example by ensuring that the input or output buffers stay active for at least a length of time after the command is received.

DETAILED DESCRIPTION

Figure 1:
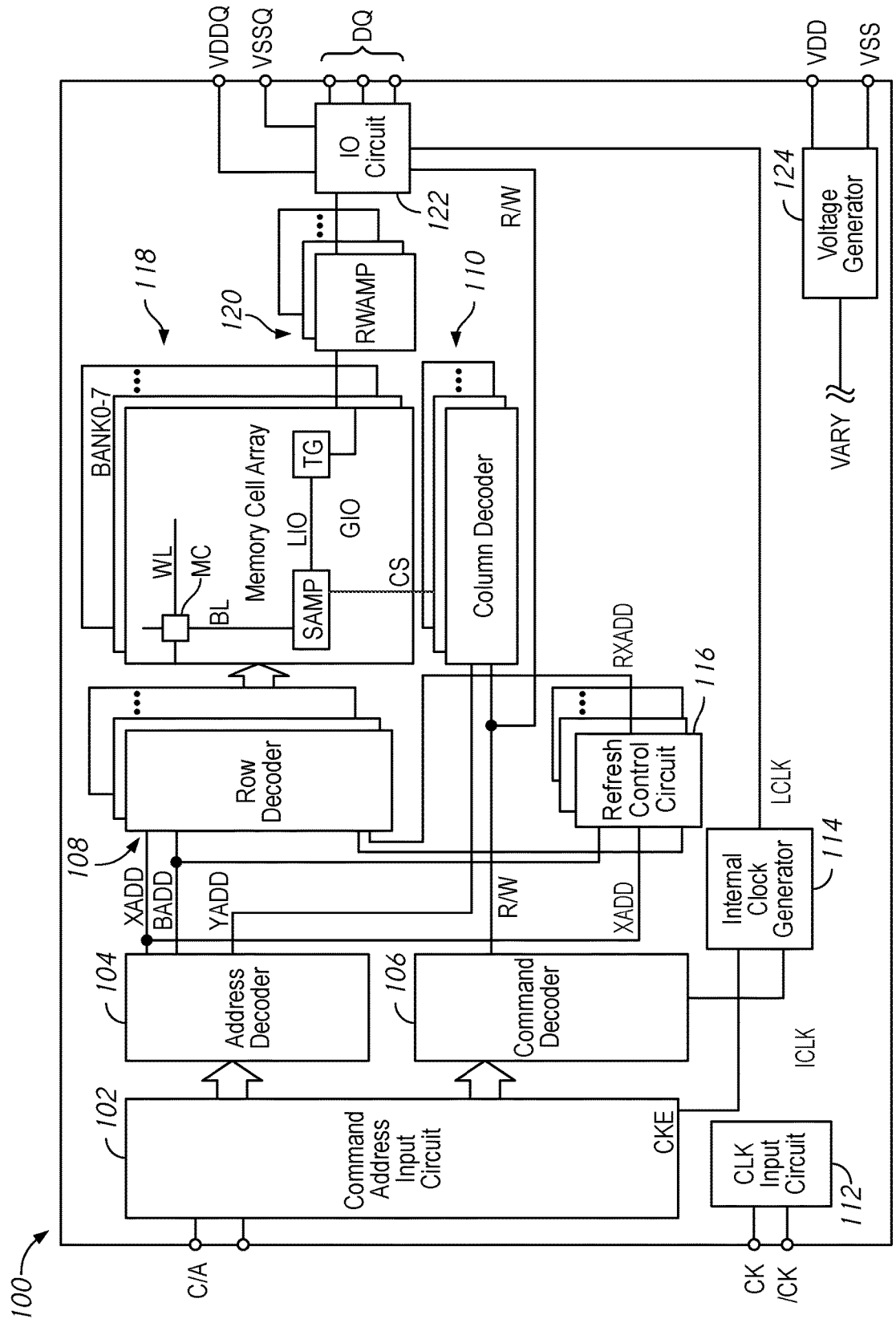
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). During a read operation, the memory may receive a read command and row and column addresses which indicate which memory cell(s) data should be read from. The data is provided to output buffers, and read off from input/output (DQ) pads of the memory. During a write operation, the memory receives a write command and row and column addresses which indicate which memory cell(s) data should be written to. Responsive to the write command, the memory activates an input buffer, which allows data to be received from the DQ pads. The input buffer may be kept active for at least a set amount of time after the write command is received. For example, a command shifter may pass the write command through multiple latches, and as long as the command remains in at least one latch, a data input buffer enable signal may remain active.

However, there may be certain situations where the data bus enable signal improperly deactivates. For example, if multiple write commands are received, there may be circumstances where a second write command enters the command shifter in such a way that the data input buffer enable signal glitches and briefly goes to an inactive level, even though it should remain active. This may interrupt proper receipt of data. While various adjustments may be made to compensate for this (e.g., by trimming the timing of various circuits), this may be an imperfect solution since the adjustments may need to be extremely precise, and the timing may shift (e.g., due to VTC). There may thus be a need to manage the timing of the data input buffer enable signal.

The present disclosure is drawn to apparatuses, systems, and methods for input buffer clock synchronization. The memory may synchronize changes to the state of the data buffer input enable signal to the same clock signal used to control the timing of how long the data bus enable signal is provided for. When multiple commands are received, if the gap between the data buffer enable signal being active due to the first command and the second command being received is less than a predetermined amount of time based on the clock signal, the data buffer enable signal may be kept at an active level. For example, when a write command is received, it may be passed through a command shifter which is synchronized to a clock signal. The command shifter includes a number of flip-flops in series, each with clock terminals coupled in common to the clock signal. Each flip-flop in the command shifter provides a respective internal command signal which indicates if the command is in that latch or not. Data input buffer enable logic receives each of the internal command signals from the flip-flops and provides an initial data buffer input enable signal at an active level if any of the signals is active (e.g., for as long as the write command is passing through the command shifter). The initial data buffer enable signal is passed through a second shifter which is synchronized to the same clock signal as the command shifter. The second shifter provides a synchronized data buffer enable signal which is used to enable the data input buffers. Accordingly, changes to the level of the data input buffer enable signal (e.g., rising and falling edges of the signal) will be synchronized to the clock signal. This may prevent glitches which inadvertently cause short changes to the level of the enable signal. For example, if two commands are received in series, and the gap between the internal command signals is less than a period of the clock signal, the data buffer enable signal may remain active.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more sub-banks. While embodiments where each bank includes two sub-banks are generally described herein, other embodiments may include more sub-banks per bank.

Each memory sub-bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

During a write operation, the IO circuits 122 may receive the write command and activate input buffers for a period of time after receiving the write command. For example, the IO circuits 122 may activate a data input buffer enable signal for a number of LCKL cycles after receiving the write command. When the data input buffer enable signal is active, data input buffers of the IO circuit 122 are activated, which allows the write data to be received from the DQ terminals. The data input buffers may then provide the write data along the memory bus to the array 118. The data input buffer enable signal may also be synchronized to the same clock LCLK used to count how long the enable signal should be active for. Rising and falling edges of the data input buffer enable signal may be synchronized to LCLK.

In some embodiments, the clock signal (e.g., LCLK) may be divided into a first divided clock signal and a second divided clock signal. The two divided clock signals may be used to The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG. 1). The row decoder 108 performs a refresh operation on one or more word lines associated with RXADD. The refresh control circuit 116 may perform multiple types of refresh operation, which may determine how the address RXADD is generated, as well as other details such as how many word lines are associated with the address RXADD.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
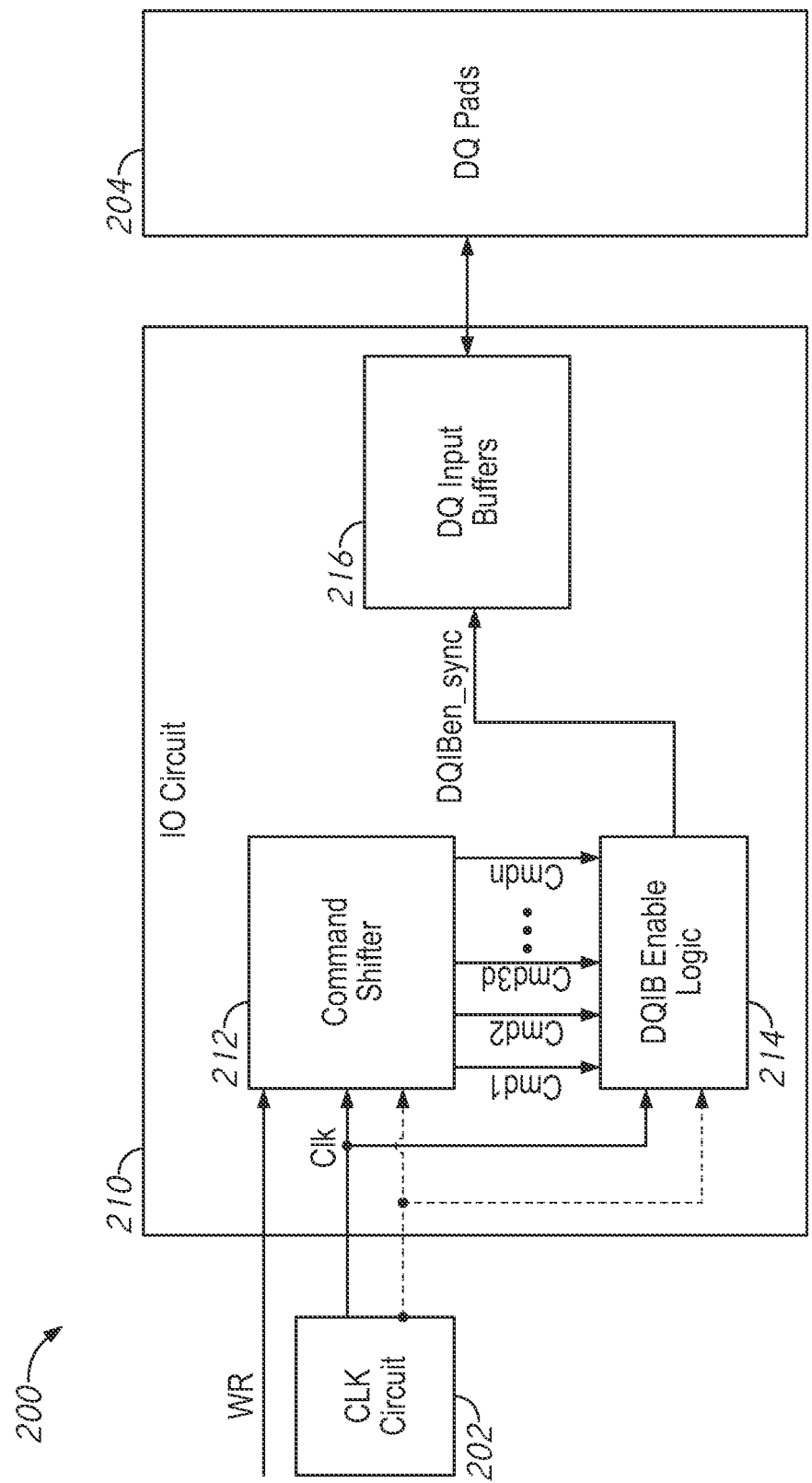
FIG. 2 is a block diagram of write timing logic according to some embodiments of the present disclosure.

FIG. 2 is a block diagram of write timing logic according to some embodiments of the present disclosure. The writing timing logic 200 shows components of a memory device related to the timing of receiving write data responsive to a write command. For example, the write timing logic 200 may represent components of a memory device such as the memory device 100 of FIG. 1.

The writing timing logic includes an IO circuit 210 (e.g., 122 of FIG. 1) and DQ pads 204. The IO circuit 210 includes input buffers 216 which receive data (e.g., write data) from the DQ pads 204 when they are active. The input buffers 216 are active when a data input buffer enable signal DQIBen_sync is at an active level (e.g., a logical high). The signal DQIBen_sync is provided at an active level for a number of cycles of a clock signal Clk after the write command WR is received. Changes in the level of DQIBen_sync are synchronized to the clock signal Clk from clock circuit 202 (e.g., clock signal LCLK and clock circuit 114 of FIG. 1) to help ensure that there are no unintended changes to DQIBen_sync.

The IO circuit 210 includes a command shifter 212 which includes a number of latches, such as flip-flops, each of which provides command signals Cmd0 to Cmdn. The IO circuit 210 also includes DQIB enable logic 214 which provides the signal DQIBen_sync as long as one of the internal command signals Cmd1 to Cmdn is active, with timing synchronized to the clock Clk. The number of command signals Cmd1 to Cmdn may be based on a number of latches in the command shifter 212, which in turn may be determined based on the amount of time (e.g., the number of clock cycles) it is desired to keep the signal DQIBen_sync active after receiving a write command.

The data input buffer enable logic 214 provides the signal DQIBen_sync with a level based on the level of the command signals Cmd1 to Cmdn from the command shifter 212. Changes to the level of DQIBen_sync are synchronized to the same clock Clk used to operate the command shifter 212. This may be useful for mitigating glitches caused by short changes to the state of the command signals Cmd1 to Cmdn. If the gap between the signals Cmd1 to Cmdn falling to a low level after a first command is received and at least one of Cmd1 to Cmdn becoming active due to a second command is less than a predetermined period of time, then the signal DQIBen_sync may remain active. For example, if all of the command signals briefly go to a low logical level, the overall signal DQIBen_sync won't switch to a low logical level unless all of the command signals are low for a period tClk, which is the period of the clock signal Clk.

When the signal DQIBen_sync is active, the data input buffers 216 may be active and may receive data from the DQ pads. The input buffers 216 may provide the received data along a data bus.

Figure 3:
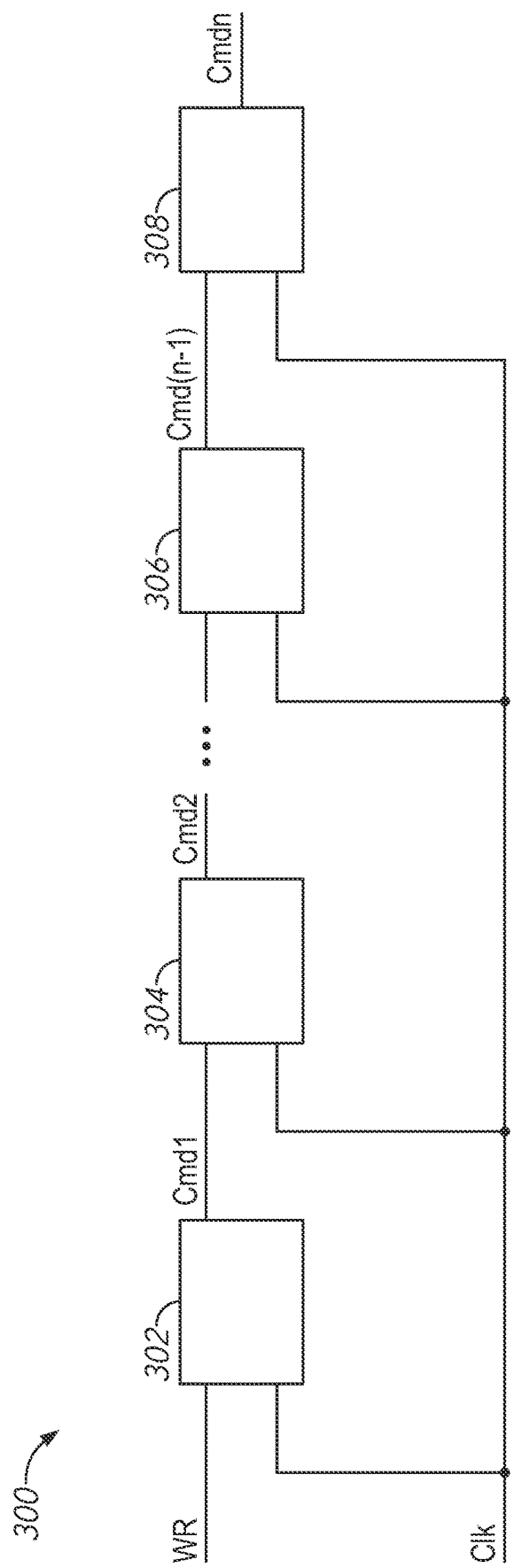
FIG. 3 is a block diagram of a command shifter according to some embodiments of the present disclosure.
Figure 4:
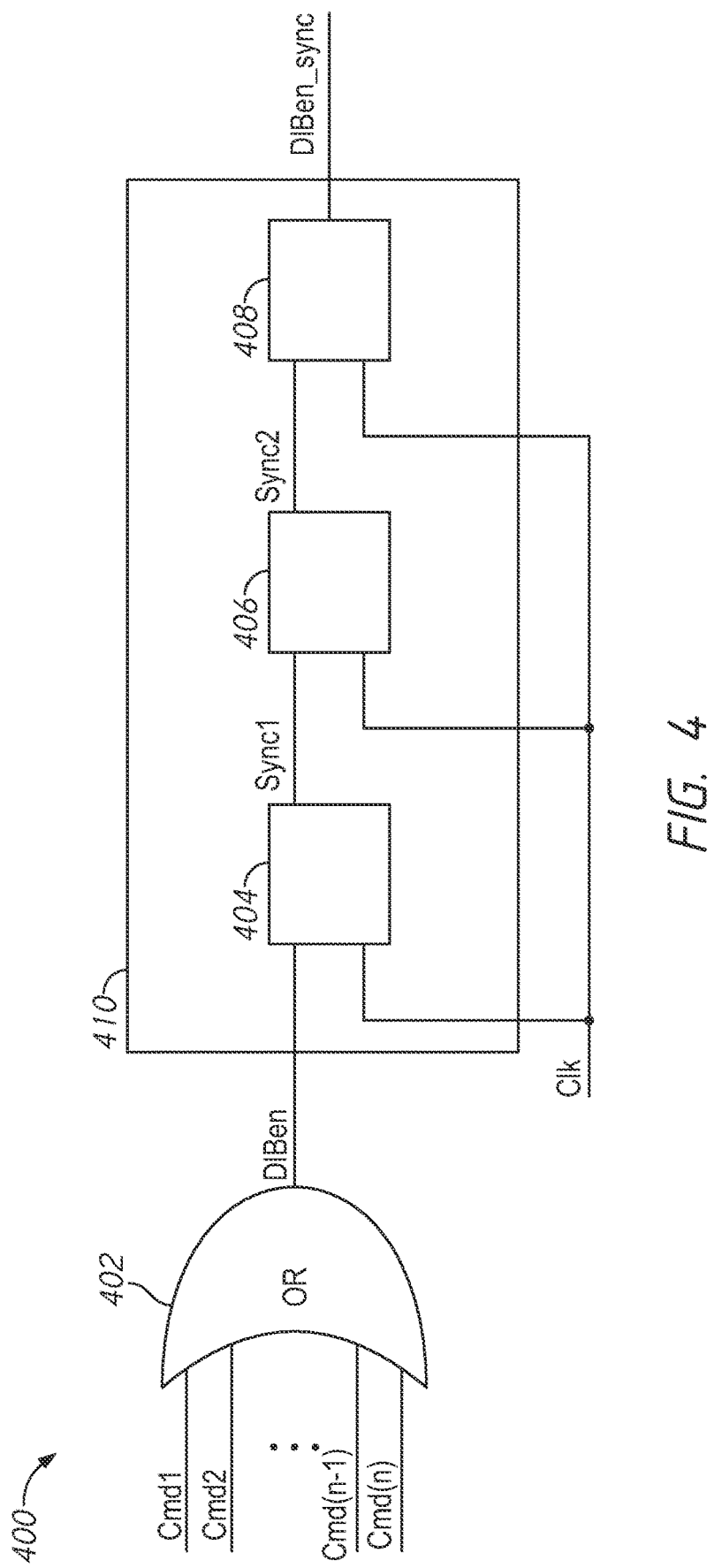
FIG. 4 is a block diagram of data input buffer enable logic according to some embodiments of the present disclosure.
Figure 5:
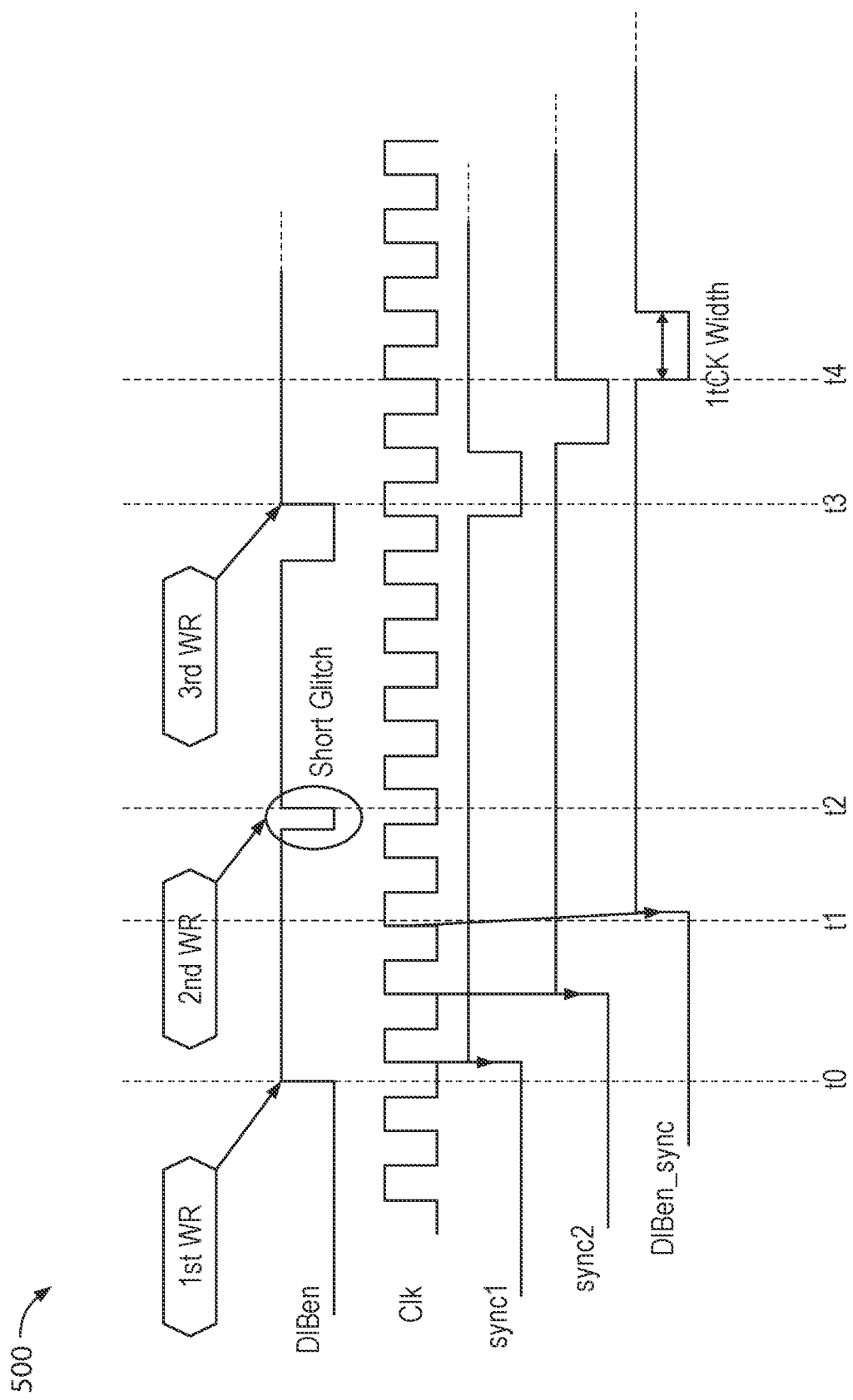
FIG. 5 is a timing chart of operations of data input buffer enable logic according to some embodiments of the present disclosure.

An example command shifter 212, enable logic 214 and operations thereof are described in more detail in FIGS. 3-5. In some embodiments the clock signal Clk may be a divided clock signal, as represented by the dotted line. The clock circuit 202 may include a divider circuit, which splits a clock signal Clk into two divided clock signals. As described in more detail herein, when the clock is divided, the command shifter 212 may include two sets of shifters, one for each divided clock signal (e.g., an even and odd set of shifters). Example shifters, enable logic and operations using a divided clock signal are described in more detail in FIGS. 6-8.

FIG. 3 is a block diagram of a command shifter according to some embodiments of the present disclosure. The command shifter 300 may, in some embodiments, implement the command shifter 212 of FIG. 2.

The command shifter 300 includes a number of latches 302-308. The number of latches determines the number of clock cycles that DBIQen_sync is provided for. The latches 302-308 are coupled in series, such that each latch has an input terminal coupled to an output of the previous latch in the series. The latches 302-308 have clock terminals coupled in common to the clock signal Clk.

The first latch 302 has an input coupled to the write command WR and provides a first command signal Cmd1. The second latch 304 has an input coupled to Cmd1 and provides a second command signal Cmd2 and so forth until the last latch 308 receives a command Cmd(n−1) and provides Cmdn.

Accordingly, when a write command WR is active, a first activation of the clock signal (e.g., a first rising edge) will cause the signal WR to be latched, and the signal Cmd1 to become active. After a next activation of Clk, Cmd2 will become active and (assuming WR has fallen back to an inactive level), Cmd1 will become inactive. In this manner, at least one of the command signals Cmd1 to Cmdn will be active for n activations of Clk after the write command WR is received. The number n may be chosen based on the timing constraints of the memory device.

FIG. 4 is a block diagram of data input buffer enable logic according to some embodiments of the present disclosure. The data input buffer enable logic 400 may, in some embodiments, be an implementation of the data input buffer enable logic 214 of FIG. 2.

The data buffer input logic 400 includes a logic gate 402 which receives the commands cmd1 to cmdn from the command shifter (e.g., 212 of FIGS. 2 and/or 300 of FIG. 3) and provides an initial enable signal, or intermediate data buffer signal, DIBen. For example, the logic gate 402 may represent OR logic, which provides the signal DIBen at an active level whenever any of the commands cmd1 to cmdn are active (e.g., for as long as the write command is passing through the command shifter).

The initial signal DIBen is provided to a synchronizer circuit 410. The synchronizer provides the overall signal DIBen_sync in synchronization with the clock signal Clk. For example, the synchronizer circuit 410 may include a shifter circuit. The shifter circuit includes a number of latches, such as flip-flops, coupled in series in a manner analogous to the command shifter 300 of FIG. 3. In the example embodiment of FIG. 4, the synchronizer 410 includes a shifter with 3 latches 404-408. However, more or fewer latches, or other forms of synchronization may be used in other example embodiments.

Each of the latches 404-408 has an input coupled to the output of the previous latch in the shifter, and all of the latches 404-408 have clock terminals coupled in common to the clock signal Clk, which is the same clock signal which operates the command shifter. The first latch 404 receives the signal DIBen. The final latch 408 provides the synchronized signal DIBen_sync.

When commands are received in series, there may be gaps between times when the intermediate signal DIBen is active. However, if the gap is less than a predetermined period of time, the combined data input buffer enable signal DIBen_sync may remain at an active level despite the gaps between DIBen. For example, if the gap between DIBen being active is less than a period of the clock signal that DIBen_sync is synchronized to, then the signal DIBen_sync may remain active. If the gap is larger than the period of time, then the signal DIBen_sync may fall to an inactive level.

FIG. 5 is a timing chart of operations of data input buffer enable logic according to some embodiments of the present disclosure. The timing diagram 500 may, in some embodiments, represent the operation of the data buffer enable logic 214 of FIGS. 2 and/or 400 of FIG. 4.

The timing diagram 500 shows an initial or intermediate signal DIBen which is at an active level when a write command is passing through a command shifter (e.g., 300 of FIG. 3). For reference, the times that write commands were received are also noted. In the example of FIG. 5, three write commands are received in sequence. The timing diagram 500 also shows clock signal Clk, and synchronization signals sync1 and sync2 provided by the latches of the synchronization circuit (e.g., the values stored in latch 404 and 406 of FIG. 4 respectively) as well as the overall signal DIBen_sync.

At an initial time t0, a first write command is received and the initial signal DIBen becomes active (e.g., because at least one of cmd0 to cmdn is active). After the initial time t0, and in synchronization with the clock signal Clk, sync 1 becomes active, followed by sync2. At a first time t1, the overall signal DIBen_sync becomes active in synchronization with the clock signal Clk.

At a second time t2, a second write command is received. The second write command may be received just after the first write command (received at t0) has passed through the command shifter. Accordingly, there may be a brief period just before t2 where the initial or intermediate signal DIBen falls to a low level. This gap may represent a 'short glitch' because it is out of synchronization with the clock signal and could cause problems with the operation of the memory if the input buffers were briefly toggled off. However, because the short glitch is shorter than a period tCK of the clock signal Clk, even though DIBen briefly falls to a low level, sync1, and thus sync2 and DIBen_sync remain at a high logical level throughout since the amount of time DIBen was at a low level is below a predetermined amount of time (e.g., less than tCK). In this way the short glitch before the second write command does not cause any change to the level of DIBen_sync, and thus the input buffers remain active.

At a third time t3, a third write command is received. In this case, there is a gap between the second write command leaving the command shifter and the third write command being received which is about one tCK in length. Since the input buffers may be deactivated without causing a glitch, this gap may propagate to DIBen_sync. Accordingly, after the time t3, the signal sync1 briefly falls to an inactive level, followed by sync2 as the gap move through the latches of the synchronization circuit. At a time t4, the signal DIBen_sync falls to an inactive level, before returning to an active level in synchronization with the clock signal Clk. The gap after the time t4 may be 1 tCK in length. Other gaps may also be allowed to pass through to DIBen_sync, but due to the synchronization with Clk they will be at least tCK in length. For example, periods where DIBen_sync is either active or inactive may be some length M*tCK where M is an integer.

Figure 6:
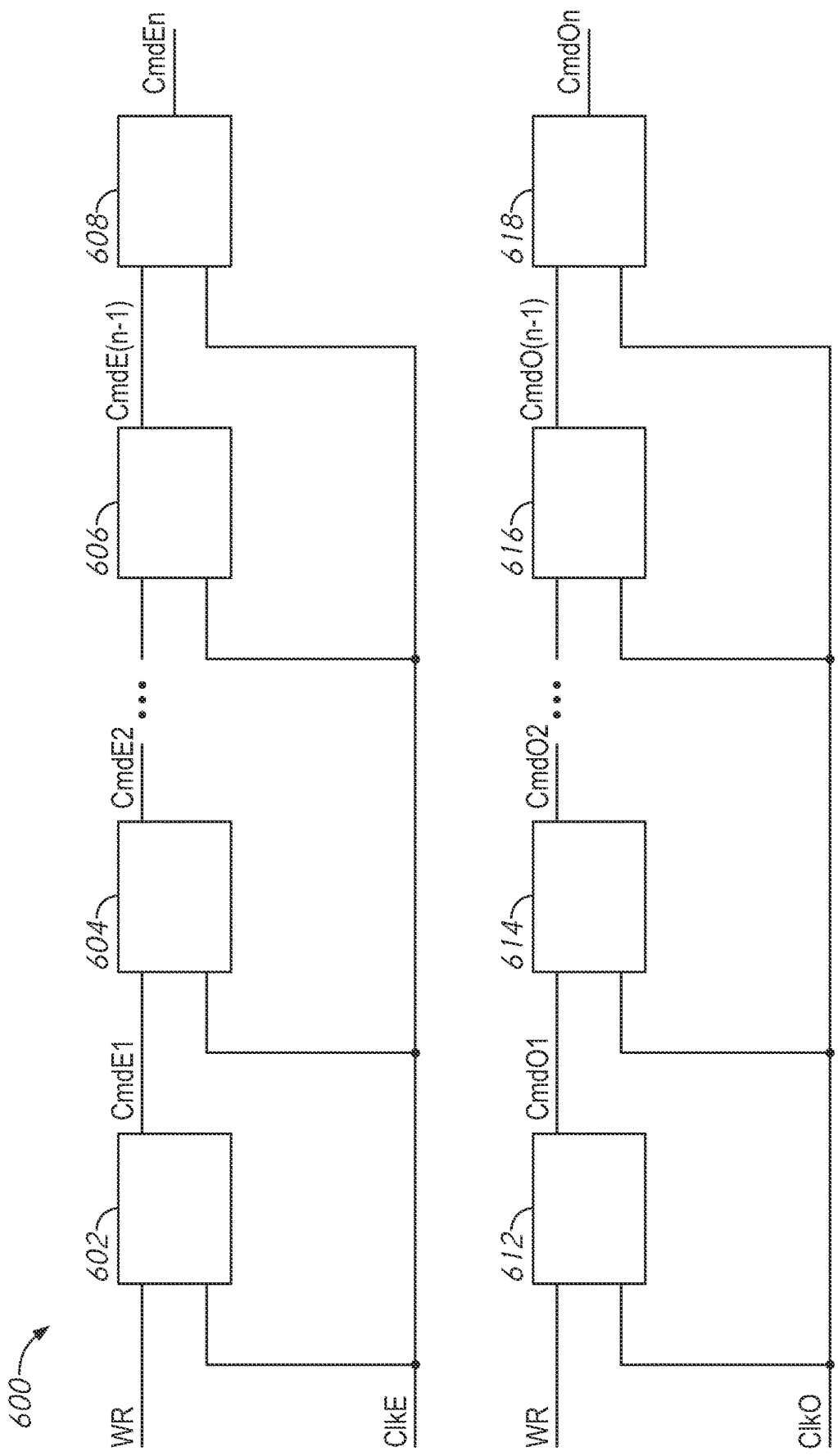
FIG. 6 is a block diagram of a command shifter according to some embodiments of the present disclosure.

FIG. 6 is a block diagram of a command shifter according to some embodiments of the present disclosure. The command shifter 600 may, in some embodiments, implement the command shifter 212 of FIG. 2. The command shifter 600 may generally be similar to the example command shifter 300 of FIG. 3. However, the command shifter 600 of FIG. 6 uses a divided clock signal. For the sake of brevity, components, operations, and features similar to those described with respect to FIG. 3 will not be repeated again with respect to FIG. 6.

The command shifter 600 of FIG. 6 includes a first shifter which includes latches (e.g., flip-flops) 602-608 and a second shifter which includes latches 612-618. Each shifter includes a set of latches coupled in series, with each latch having an input coupled to an output of the previous latch in the series.

In the embodiment of a FIG. 6, a clock signal Clk may be divided into a first clock signal ClkE and a second clock signal ClkO. For ease of reference the divided clock signals may be considered even and odd clock signals. The divided clock signals CMkE and ClkO may have twice a period of the original clock signal Clk (e.g., a period of tCK), but may be offset in phase from each other.

For example, the latch 602 receives a write command WR and provides a first even command CmdE1, the second latch 604 receives CmdE1 and provides CmdE2 and so forth, up to latch 608 which receives CmdE(n−1) from latch 606 and provides CmdEn. Each of the latches 602-608 is coupled in common to a first divided clock signal ClkE.

Similarly, the latch 612 receives the write command WR and provides a first odd command CmdO1, the second latch 614 receives CmdO1 and provides CmdO2 and so forth, up to latch 618 which receives CmdO(n−1) from latch 616 and provides CmdOn. Each of the latches 612-618 is coupled in common to the second divided clock signal ClkO.

Figure 7:
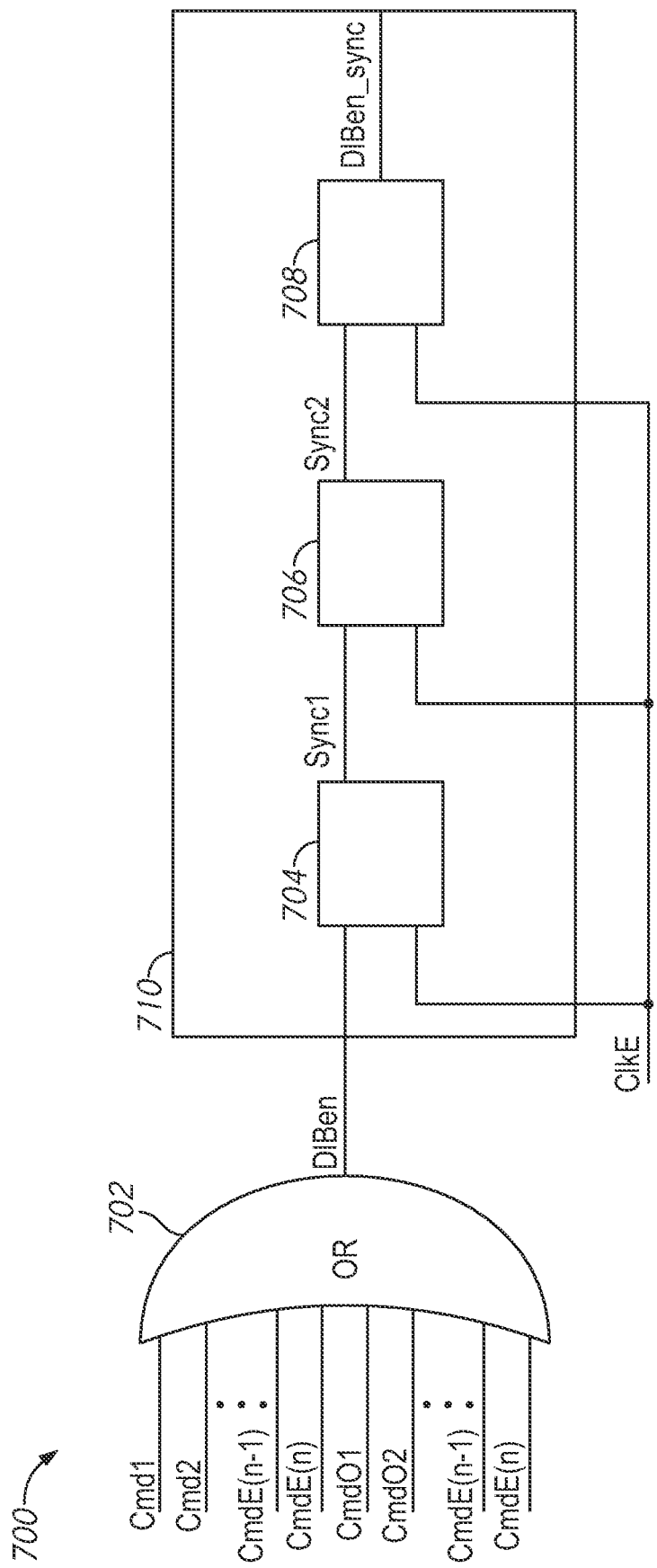
FIG. 7 is a block diagram of data input buffer enable logic according to some embodiments of the present disclosure.

FIG. 7 is a block diagram of data input buffer enable logic according to some embodiments of the present disclosure. The data input buffer enable logic 700 may, in some embodiments, be an implementation of the data input buffer enable logic 214 of FIG. 2. However, data input buffer enable logic 700 of FIG. 7 uses a divided clock signal. For the sake of brevity, components, operations, and features similar to those described with respect to FIG. 4 will not be repeated again with respect to FIG. 7. The data input buffer enable logic 700 may receive signals from the command shifter 600 of FIG. 6 in some embodiments.

The data buffer enable logic 700 includes a logic gate 702 which provides an initial or intermediate data buffer enable signal DIBen. The logic gate receives the even and odd command signals from the command shifter (e.g., from latches 602-618 of FIG. 6). If any of the command signals is active, the signal DIBen may be active. For example, the logic gate 702 may be OR logic.

The data buffer enable logic 700 also includes a synchronizer circuit 710 which provides an overall data input buffer enable signal DIBen_sync which is synchronized to one of the divided clock signals. In the example of FIG. 7, the first divided clock signal ClkE (e.g., the even divided clock signal) is used. However, other embodiments may use the second divided clock signal ClkO (e.g., the odd divided clock signal).

The synchronizer circuit 710 includes a shifter, similar to the shifter of the synchronizer 410 of FIG. 4. In the example embodiment of FIG. 7, the synchronizer 710 includes a shifter with 3 latches 704-708. However, more or fewer latches, or other forms of synchronization may be used in other example embodiments.

Each of the latches 704-708 has an input coupled to the output of the previous latch in the shifter, and all of the latches 704-708 have clock terminals coupled in common to the divided clock signal ClkE (or to ClkO in other embodiments). The first latch 704 receives the signal DIBen. The final latch 708 provides the synchronized signal DIBen_sync. Similar to the logic 400 of FIG. 4, if there is a gap in DiBen which is less than a predetermined period (e.g., less than a period of ClkE or ClkO), then DIBen_sync may remain active.

Figure 8:
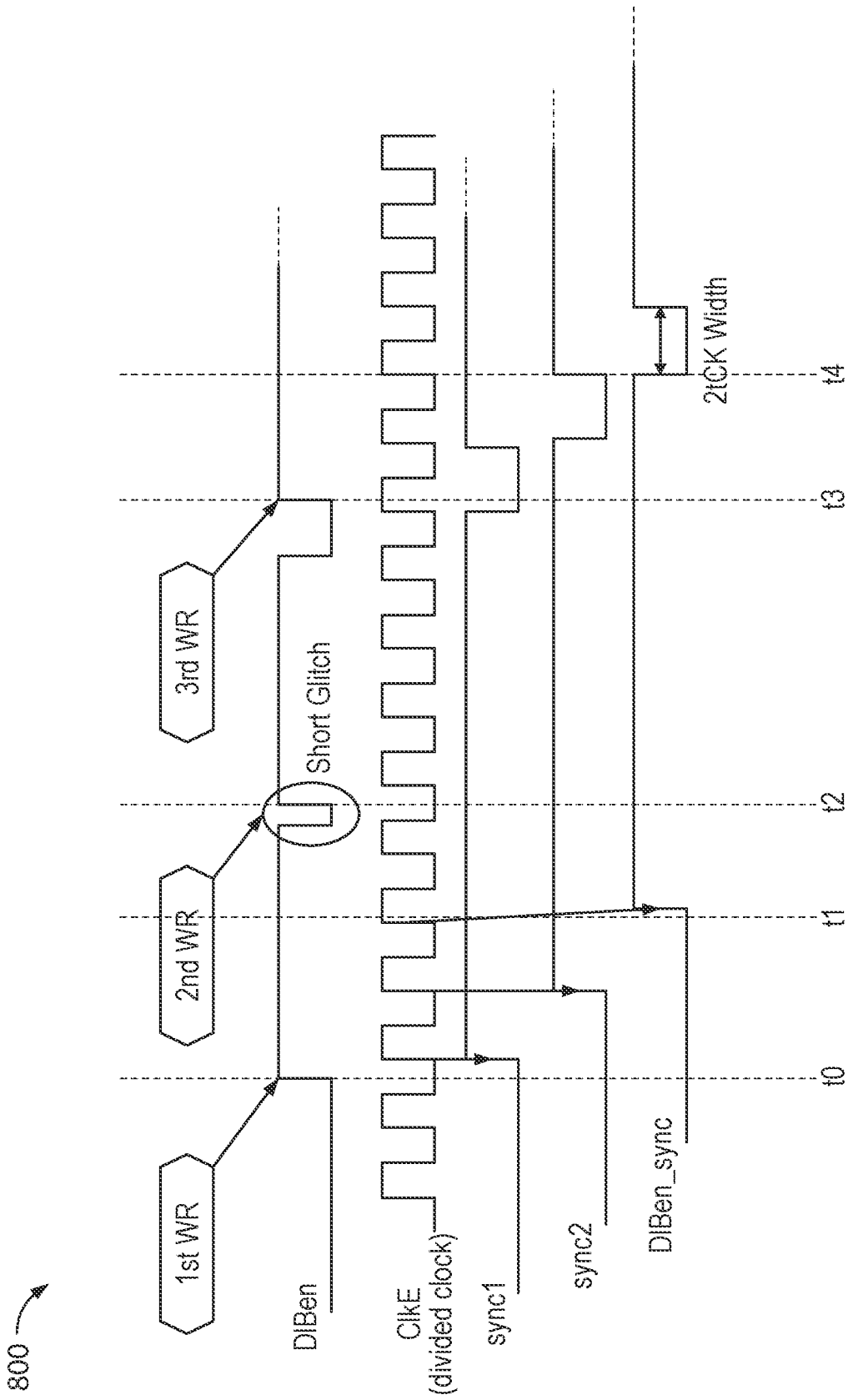
FIG. 8 is a timing chart of operations of data input buffer enable logic according to some embodiments of the present disclosure.

FIG. 8 is a timing chart of operations of data input buffer enable logic according to some embodiments of the present disclosure. The timing diagram 800 may, in some embodiments, represent the operation of the data buffer enable logic 214 of FIG. 2 and/or 700 of FIG. 7. The timing diagram 800 may generally be similar to the timing diagram 500 of FIG. 5, except that in the timing diagram 800 uses a divided clock signal.

The timing diagram 800 shows an initial signal DIBen which is at an active level when a write command is passing through a command shifter (e.g., 600 of FIG. 6). For reference, the times that write commands were received are also noted. In the example of FIG. 8, three write commands are received in sequence. The timing diagram 800 also shows divided clock signal ClkE, and synchronization signals sync1 and sync2 provided by the latches of the synchronization circuit (e.g., the values stored in latch 404 and 406 of FIG. 4 respectively) as well as the overall signal DIBen_sync. While the embodiment of FIG. 8 shows a divided clock signal ClkE, the other divided clock signal (ClkO) may be used in other example embodiments. The operation of FIG. 8 would be similar, but offset in phase compared to the timing shown in FIG. 8.

At an initial time t0, a first write command is received and the initial signal DIBen becomes active (e.g., because at least one of cmd0 to cmdn is active). After the initial time t0, and in synchronization with the divided clock signal CMkE, sync 1 becomes active, followed by sync2. At a first time t1, the overall signal DIBen_sync becomes active in synchronization with the divided clock signal ClkE.

At a second time t2, a second write command is received. The second write command may be received just after the first write command (received at t0) has passed through the command shifter. Accordingly, there may be a brief period just before t2 where the initial signal DIBen falls to a low level. This brief period may represent a 'short glitch' because it is out of synchronization with the clock signal and could cause problems with the operation of the memory if the input buffers were briefly toggled off. However, because the short glitch is shorter than a period tCK2 of the clock signal CMkE, even though the intermediate signal DIBen briefly falls to a low level, sync1, and thus sync2 and DIBen_sync remain at a high logical level throughout. In this way the short glitch before the second write command does not cause any change to the level of DIBen_sync, and thus the input buffers remain active.

At a third time t3, a third write command is received. In this case, there is a gap between the second write command leaving the command shifter and the third write command being received which is about two tCK in length. Since the input buffers may be deactivated without causing a glitch, this gap may propagate to DIBen_sync. Accordingly, after the time t3, the signal sync1 briefly falls to an inactive level, followed by sync2 as the gap move through the latches of the synchronization circuit. At a time t4, the signal DIBen_sync falls to an inactive level, before returning to an active level in synchronization with the clock signal Clk. The gap after the time t4 may be 2tCK in length. Other gaps may also be allowed to pass through to DIBen_sync, but due to the synchronization with Clk they will be at least 2tCK in length. For example, periods where DIBen_sync is either active or inactive may be some length M*2tCK where M is an integer.

Figure 9:
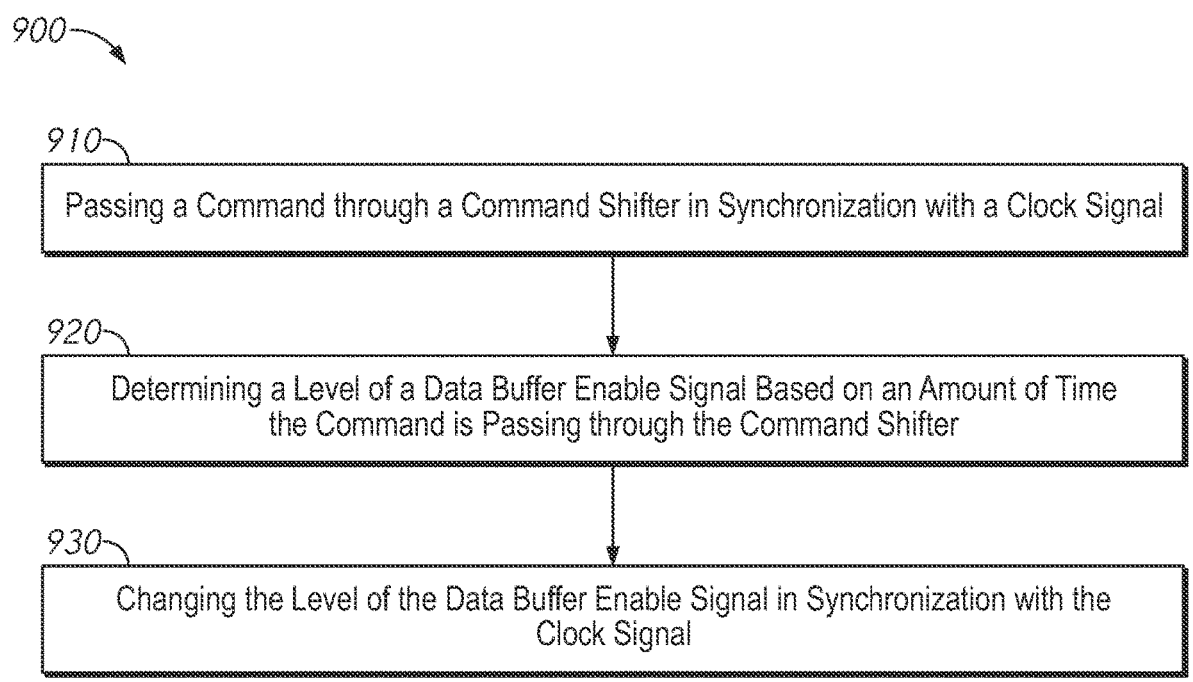
FIG. 9 is a flow chart of a method according to some embodiments of the present disclosure.

FIG. 9 is a flow chart of a method according to some embodiments of the present disclosure. The method 900 may, in some embodiments, be performed by one or more of the apparatuses or systems described herein. For example, the method 900 may represent an operation of data input buffer enable logic, such as the logic 200 of FIG. 2.

The method 900 includes block 910 which describes passing a command through a command shifter in synchronization with a clock signal. The method 900 may include receiving a write command as the command as part of a write operation. The command shifter (e.g., 212 of FIG. 2, 300 of FIGS. 3 and/or 600 of FIG. 6) may include a plurality of serial latches. The method 900 may include receiving the command at an input terminal of a first of the plurality of latches in synchronization with the clock and providing the command through each of the plurality of latches in a series in synchronization with the clock signal. Each of the plurality of latches may provide a respective one of a plurality of command signals, where at least one of the plurality of command signals is active for as long as the command is passing through the command shifter.

In some embodiments, the method 900 may include dividing the clock signal into a first divided clock signal and a second divided clock signal. The block 910 may include passing the command through a first command shifter (e.g., latches 602-608 of FIG. 6) in synchronization with the first divided clock signal and passing the command through a second command shifter (e.g., latches 612-618 of FIG. 6) in synchronization with the second divided clock signal. Each of the first and the second command shifter may provide a respective one of a first plurality of command signals and a respective one of a second plurality of command signals. At least one of the first plurality of command signals may be active for as long as the command is in the first command shifter and at least one of the second plurality of command signals may be active for as long as the command is in the second command shifter.

The method 900 includes block 920, which describes determining a level of a data buffer enable signal based on an amount of time the command is passing through the command shifter. For example, a logic gate (e.g., 402 of FIGS. 4 and/or 702 of FIG. 7) may provide an initial enable signal if any of the command signals (or any of the first or any of the second command signals) is active. The method 900 may include providing the initial enable signal to a synchronizer (e.g., 410 of FIGS. 4 and/or 710 of FIG. 7).

The method 900 includes changing the level of the data buffer enable signal in synchronization with the clock signal. For example, the synchronizer may change a level of the data buffer enable signal based on a level of the initial enable signal in synchronization with the clock signal. The synchronizer may include a shifter synchronized to the clock signal. In embodiments with a divided clock, the synchronizer may be synchronized to the first divided clock or the second divided clock.

The method 900 may include activating data input buffers responsive to the data buffer enable signal at an active level. The method 900 may include receiving write data from data terminals when the data input buffers are active. The method 900 may include writing the write data to a memory array.

The method 900 may include changing the level of the data buffer enable signal if the initial enable signal changes level for a period of the clock signal or more. In embodiments where a divided clock is used, the method 900 may include changing the level of the data buffer enable signal if the initial enable signal changes level for two periods of the clock signal or more.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    data buffer enable logic configured to provide a first intermediate data buffer enable signal and a second intermediate data buffer signal in series responsive to a first command and a second command received in series and output a combined data buffer enable signal when a gap between the first intermediate data buffer enable signal and the second intermediate data buffer enable signal is less than a predetermined period of time wherein the data buffer enable logic comprises:
    a first shifter which includes a plurality of latches in series, each configured to provide one of a plurality of internal command signals; and
    a logic gate configured to provide the first and the second intermediate data buffer enable signal based on the plurality of internal command signals.

2. The apparatus of claim 1, wherein the predetermined period of time is based on a period of a clock signal.

3. The apparatus of claim 1, wherein the data buffer enable logic further comprises:
    a second shifter configured to provide the combined data buffer enable signal based on the first and the second intermediate data buffer enable signal, wherein the second shifter is synchronized to the clock signal.

4. The apparatus of claim 1, wherein the first command and the second command are write commands.

5. The apparatus of claim 1, wherein rising and falling edges of the combined data buffer enable signal are synchronized to a clock signal.

6. The apparatus of claim 1, further comprising an input buffer configured to activate responsive to the combined data buffer enable signal.

7. An apparatus comprising:
    a command shifter configured to provide a plurality of internal command signals responsive to a command, the plurality of internal command signals having respective amount of delay each defined as one or multiple number of cycles of a clock signal; and
    data buffer enable logic configured to provide a data buffer enable signal based, at least in part, on the plurality of internal command signals, wherein each of rising and falling edges of the data buffer enable signal are synchronized to the clock signal.

8. The apparatus of claim 7, wherein the data buffer enable logic includes:
    a logic gate configured to provide an initial data buffer enable signal at an active level when any of the plurality of internal command signals is active; and
    a second shifter synchronized to the clock signal, wherein the second shifter is configured to provide the data buffer enable signal with a level based on a level of the initial data buffer enable signal.

9. The apparatus of claim 8, wherein the second shifter comprises a plurality of latches coupled in series, each having a clock terminal coupled to the clock signal, wherein a first of the plurality of latches has an input coupled to the initial data buffer enable signal and wherein a last of the plurality of latches provides the data buffer enable signal.

10. The apparatus of claim 8, wherein the command is a write command.

11. The apparatus of claim 8, further comprising data input buffers configured to receive data from data terminals when the data buffer enable signal is at the active level.

12. The apparatus of claim 8, wherein the clock signal is a first divided clock signal, and wherein the command shifter comprises a first plurality of latches and a second plurality of latches, wherein the first plurality of latches is configured to provide a first plurality of internal command signals synchronized to the first divided clock signal, and wherein the second plurality of latches is configured to provide a second plurality of internal command signals synchronized to the second divided clock signal, and wherein each of the rising and the falling edges of the data buffer enable signal are synchronized to the first divided clock signal or the second divided clock signal.

13. The apparatus of claim 12, wherein the data buffer enable logic is configured to provide the data buffer enable signal at an active level when any of the first or the second plurality of internal command signal signals is active.

14. An apparatus comprising:
a first shifter comprising a first plurality of flip-flops, the first shifter configured to receive a command and pass the command through the first plurality of flip-flops in synchronization with a clock signal;
a logic gate configured to provide an initial data buffer enable signal with a level based on whether the command is in any of the first plurality of flip-flops; and
a second shifter comprising a second plurality of flip-flops, the second shifter configured to receive the initial data buffer enable signal from the logic gate and pass the data buffer enable signal through the second plurality of flip-flops in synchronization with the clock signal to generate a data buffer enable signal.

15. The apparatus of claim 14, further comprising a plurality of data buffers configured to receive data from data terminals when the data buffer enable signal is at an active level.

16. The apparatus of claim 14, wherein the command is a write command.

17. The apparatus of claim 14, wherein each of the first plurality of flip-flops is configured to provide a respective one of a plurality of internal command signals, and wherein the logic gate is configured to provide the initial data buffer enable signal with a level based on the plurality of internal command signals.

18. The apparatus of claim 14, wherein the clock signal is a first divided clock signal, the apparatus further comprising a divided circuit configured to provide the first divided clock signal and a second divided clock signal based on an initial clock signal.

19. The apparatus of claim 18, further comprising a third shifter comprising a third plurality of flip-flops, the third shifter configured to receive the command and pass the command through the third plurality of flip-flops in synchronization with the second divided clock signal.

20. The apparatus of claim 19, wherein the logic gate is further configured to provide the initial data buffer enable signal with a level based on whether the command is in any of the first plurality of flip-flops or the second plurality of flip-flops.

21. A method comprising:
passing a command through a command shifter in synchronization with a clock signal;
determining a level of a data buffer enable signal based on an amount of time the command is passing through the command shifter;
changing the level of the data buffer enable signal in synchronization with the clock signal;
activating data input buffer circuits responsive to the data buffer enable signal at an active level; and
receiving data from data terminals when the data input buffer circuits are active.

22. The method of claim 21, further comprising receiving a write command as the command as part of a write operation.

23. A method comprising:
passing a command through a command shifter in synchronization with a clock signal;
determining a level of a data buffer enable signal based on an amount of time the command is passing through the command shifter;
changing the level of the data buffer enable signal in synchronization with the clock signal;
dividing an initial clock signal into a first divided clock signal which is the clock signal and a second divided clock signal; and
passing the command through a second command shifter in synchronization with the second divided clock signal.

24. The method of claim 23, further comprising:
synchronizing rising and falling edges of the data buffer enable signal to the clock signal.

25. A method comprising:
passing a command through a command shifter in synchronization with a clock signal;
determining a level of a data buffer enable signal based on an amount of time the command is passing through the command shifter; and
changing the level of the data buffer enable signal in synchronization with the clock signal, wherein the command shifter includes a plurality of latches each configured to provide a respective one of a plurality of internal command signals, the method further comprising setting the data buffer enable signal at an active level based on the plurality of internal command signals.

26. A method comprising:
passing a command through a command shifter in synchronization with a clock signal;
determining a level of a data buffer enable signal based on an amount of time the command is passing through the command shifter; and
changing the level of the data buffer enable signal in synchronization with the clock signal;
receiving the command at a first time;
receiving a second command at a second time; and
maintaining the level of the data buffer enable signal at the active level if the different between the first time and the second time is less than a predetermined period of time.

* * * * *